(12) United States Patent
Das et al.

(10) Patent No.: US 7,162,675 B2
(45) Date of Patent: Jan. 9, 2007

(54) ERROR DETECTION METHODS IN WIRELESS COMMUNICATION SYSTEMS

(75) Inventors: Arnab Das, Old Bridge, NJ (US); Farooq Ullah Khan, Manalapan, NJ (US); Ashwin Sampath, Somerset, NJ (US); Hsuan-Jung Su, Ocean, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 406 days.

(21) Appl. No.: 10/115,967

(22) Filed: Apr. 5, 2002

(65) Prior Publication Data

US 2003/0192003 A1 Oct. 9, 2003

(51) Int. Cl.
*H03M 13/00* (2006.01)
*H04L 1/18* (2006.01)

(52) U.S. Cl. ............. 714/751; 714/774; 714/776
(58) Field of Classification Search ............ 714/751, 714/774, 776
See application file for complete search history.

(56) References Cited

U.S. PATENT DOCUMENTS

| | | | | |
|---|---|---|---|---|
| 4,675,871 A | * | 6/1987 | Gordon et al. | 714/789 |
| 5,157,672 A | * | 10/1992 | Kondou et al. | 714/795 |
| 5,208,816 A | | 5/1993 | Seshardi et al. | 371/43 |
| 6,094,465 A | | 7/2000 | Stein et al. | 375/346 |
| 6,108,811 A | | 8/2000 | Nakamura et al. | |
| 6,205,186 B1 | | 3/2001 | Butler et al. | 375/341 |
| 6,581,182 B1 | * | 6/2003 | Lee | 714/795 |
| 6,732,302 B1 | * | 5/2004 | Palenius et al. | 714/48 |
| 6,795,425 B1 | * | 9/2004 | Raith | 370/345 |
| 2002/0006138 A1 | | 1/2002 | Odenwalder | 370/468 |
| 2002/0145985 A1 | * | 10/2002 | Love et al. | 370/328 |

FOREIGN PATENT DOCUMENTS

| EP | 0 413 505 A1 | 2/1991 |
|---|---|---|
| EP | 413505 A1 | 3/2001 |
| EP | 1 248 485 A | 10/2002 |
| EP | 1248485 A1 | 10/2002 |

OTHER PUBLICATIONS

Yamamoto, H.; Itoh, K.; Asymptotic performance of a modified Schalkwijk-Barron scheme for channels with noiseless feedback (Corresp.), IEEE Transactions on Information Theory, vol. 25 , Issue: 6 , Nov. 1979, pp. 729-733.*
Lucent Technologies, Inc., "Downlink and Uplink Channel Structures for HSDPA", Nov. 21-24, 2000, 1-7.
Motorola and Philips; Way Forward on HS-SCCH[1], TDOC R1-02-0463 of 3GPP TSG RAN WG 1, HTTP://WWW.3GPP.ORG, 18.; Feb. 22, 2002, pp. 1-2.
Texas Instruments: [1]HS-SCCH: Performance Results and Improved Structure[1], TDOC R1-02-0535 of 3GPP TSG RAN WG 1, http://list.etsi.org/scripts/wa.exe? A2=ind0204&L=3gpp_tsg_ran_wg1&T=O&F=&S=&P=403, posted on Apr. 1, 2002, pp. 1-7.

(Continued)

*Primary Examiner*—Joseph Torres

(57) ABSTRACT

The error detection method includes decoding a portion of each control channel that is simultaneously received by a user equipment (UE) in a wireless communication system. The UE is provided with techniques to determine if one or more of the control channels were successfully received during the decoding step. If more than one control channel was successfully received, the method selects only one of the successfully received control channels based on calculated path metric differences (PMD) that serve as a "tie-breaking" mechanism to select the correct control channel for a particular UE.

12 Claims, 6 Drawing Sheets

OTHER PUBLICATIONS

TSG-RAN Working Group 1, Downlink and Uplink Channel Structures for HSDPA, Nov. 21, 2000, pp. 1-7, XP002206395.

European Search Report dated May 2, 2005.
European Search Report dated May 6, 2005.

* cited by examiner

ERROR DETECTION METHODS IN WIRELESS COMMUNICATION SYSTEMS

BACKGROUND OF THE INVENTION

1. Technical Field

The invention relates generally to wireless communication systems and, more particularly, to error detection methods for evaluating information that is transmitted in control channels of such systems.

2. Description of Related Art

Almost all wireless communication systems employ "frame-based" communication, where a certain number of bits, defined as a frame, are channel encoded together and transmitted. Most systems employ concatenated coding for each frame with an inner error correction code such as a convolutional or Turbo error correction code and an outer error detection code.

FIG. 1 illustrates a process flow for forming a typical concatenated code structure at the transmitter of a base station. As shown, an error detection code is added at 110 to a frame of a data channel, the frame comprising k bits. Typically a cyclic redundancy check (CRC) code, shown here as having a length p, is used as the error detection code. The CRC bits are computed based on the k information bits. The CRC code is appended to the frame (e.g., k+p bits), and then passed through error correction encoding at 120. The error correction code is, for example, a convolutional code having a rate of 1/r, where r>1. After error correction encoding, the number of bits equals (r*(k+p)), which are then passed to a modulator and transmitted over a channel. An error correction code decoder at the receiver of a user equipment (e.g., a mobile station) will attempt to correct any bit errors that take place on the channel.

In most cases, a frame is discarded when the receiver detects an error, which is uncorrectable, in the transmission based on the error detection code. This results in a loss or delay of information, depending on whether a retransmission is subsequently carried out. The most widely used error detection code is the aforementioned CRC code. Standard CRC codes include bit lengths of 8, 12, 16, 24 and/or 32 bits. The figure of merit or interest with error detection codes is the probability of an undetected error, i.e., a case where use of the inner error correction code could not correct transmission errors, and the outer error detection code did not detect that the decoded information was erroneous. This is an undetected error because the decoded information is erroneous, but the error detection code did not catch the error. The undetected error probability with CRC codes is typically on the order of $2^{-L}$ where L is the length of the CRC. Thus, an 8-bit CRC has an undetected error probability of approximately 1/256.

The overhead associated with using a CRC is dependent on the number of information bits in the frame. Typically, the number of information bits of a frame such as frame k in FIG. 1 exceeds several hundred bits, and thus any overhead effect of using an 8, 12 or 16-bit CRC is minimal. However, in certain applications very few bits need to be transmitted per frame and the overhead from using even a length-8 CRC may be excessive. One such example is in the transmission of control channel information in wireless high speed data communication systems such as in the High Speed Downlink Packet Access (HSDPA) specification of the Universal Mobile Telecommunication System (UMTS) standard.

In HSDPA, transmission data for several user equipments (hereinafter UEs, also frequently known as mobile stations) are multiplexed on a common high speed downlink shared data channel (HS-DSCH). High data rates are obtained through scheduling, adaptive modulation and coding, and hybrid automatic repeat request (H-ARQ) as is known. UEs are scheduled on the shared data channel. The UEs are scheduled either in a purely time division multiplexed (TDM) manner, where all the available resources (power resources and data channelization codes) are assigned to one UE during a transmission time interval, or among multiple UEs in a transmission time interval (TTI). When transmitting to multiple UEs in a TTI, the power resources and data channelization codes are divided up among those UEs, not necessarily in a uniform manner. In the UMTS standard, the transmission time interval (TTI) is typically 2 ms or 3 timeslots (each timeslot being about 0.667 ms). Scheduling for the UEs is typically accomplished based on some type of information about the channel quality being experienced by the UE.

An important component of these high speed wireless systems is the use of a control channel. The control channel carries information related to (a) which UEs have been scheduled to receive a data transmission via a corresponding HS-DSCH (b) what data channel codes, are assigned to each particular UE, and (c) modulation and HARQ-related information. From a system efficiency perspective, a few control channels are defined such that they are shared among all UEs, rather than providing a dedicated control channel per UE.

An exemplary configuration is to define up to M high speed shared control channels (HS-SCCHs) for simultaneous transmissions, where M=4, for example. For each TTI, each HS-SCCH carries HS-DSCH-related downlink signaling for one UE. The number of HS-SCCHs may range from a minimum of one HS-SCCH (M=1) to a maximum of four HS-SCCH's (M=4). This is the number of HS-SCCH's as seen from the UE's point-of-view. In other words, a UE determines whether an ensuing transmission on any of the HS-DSCHs is intended for itself or not only upon or after decoding information in the HS-SCCHs.

FIG. 2 illustrates the relationship between HS-SCCHs 210 and their corresponding shared HS-DSCH counterparts 220. In FIG. 2, each HS-SCCHx (x=1 to 4) carries information pertinent to a corresponding HS-DSCHx (x=1 to 4). The number of HS-DSCHs, and therefore the number of HS-SCCHs that may be used, can vary for each TTI, depending on the number of UEs being simultaneously scheduled in the TTI. Accordingly, the configuration of HS-SCCHs and HS-DSCHs in FIG. 2 enables the data channelization codes and power resources to be divided among four simultaneous transmissions.

Referring again to FIG. 2, control channel data on each HS-SCCH is typically divided into two parts. Part I consists of information relating to those data channelization codes that have been assigned to a particular UE, for example. Part II data contains HARQ related information, and other transport information. To maintain complexity low at the UE, HS-SCCH designs typically allow Part I information to be transmitted prior to the commencement (i.e., before t=0) of data transmission, as shown in FIG. 2. Accordingly, with the current configuration, each UE must decode Part I on every HS-SCCH, in every TTI, in order to determine (a) whether or not the transmission was intended for that particular UE, and (b) if the transmission was intended for that particular UE, the UE must decode Part I and figure out what channelization codes the corresponding HS-DSCH will arrive on.

Therefore, each UE must decode up to four (4) HS-SCCHs in every TTI, prior to commencement of data transmission. From a UE processing complexity perspective, it is therefore desirable to limit the number of bits in Part I that require processing, and it is also desirable that the processing be as simple as possible. At the same time, two conditions should be met for each UE. The first is that at each UE, the probability of error detection should be high. In other words, when a transmission is intended for a particular UE, that UE decodes Part I and successfully recognizes that the ensuing data transmission on the corresponding HS-DSCH is for that UE. The second condition to meet is for a probability of false alarm to be low. A false alarm is where a UE decodes Part I and erroneously recognizes that the ensuing data transmission on a corresponding HS-DSCH is for that UE.

A low probability of detection implies wasted resources, since every missed detection event means that the transmission on the corresponding HS-DSCH is wasted. A false alarm event would cause a UE that is NOT scheduled for a particular transmission to begin buffering data and try to decode the information which would waste battery resources at the UE, for example, due to unnecessary processing.

In order to ensure the above two conditions are met, typically a UE-specific CRC code is used for error detection on Part I. Accordingly, the UE will decode Part I bits and apply its unique CRC to check for errors. If there are errors, the UE will assume that the transmission is not intended for it. If use of the CRC detects no errors on Part I of the HS-SCCHs, the UE will decode Part II of the HS-SCCH and begin to buffer and decode the corresponding HS-DSCH.

Standard CRC codes having bit lengths of 12 bits or higher usually achieve acceptable detection/false alarm performance. However, Part I of the HS-SCCH usually contains only about 8 information bits, so to use a 12-bit CRC or greater represents a substantial overhead (>150%). Furthermore, the number of Part I bits the UE must process is excessive. For example, for each HS-SCCH having 8 information bits and 12 CRC bits, in order to decode the Part I information for four HS-SCCHs, the UE has to process 80 bits of data, typically within 1 timeslot of a TTI (0.667 ms). This is undesirable, and is essentially the equivalent of processing a peak data rate of 120 kbps just to decode part of the control information A conventional solution is to avoid using a CRC for error detection, and instead use a UE-specific scrambling or masking approach followed by calculation of a specific convolutional decoder metric for error detection that is described in further detail below. The principle behind this approach is that when the UE descrambles a transmission that is intended for itself, the resultant decoder metric is usually high. However, whenever the UE descrambles a transmission that was intended for some other UE, the decoder metric is usually low. Therefore, scrambling/descrambling to calculate a decoder metric, followed by comparison of the decoder metric to a threshold is one method to achieve error detection when no CRC is used.

FIG. 3 illustrates a process flow of how a scrambling code is used with a convolutional error correction code. The UE-specific scrambling (masking) code "flips" certain bits (1 to 0 and 0 to 1) based on the unique scrambling sequence assigned to the UE.

For example, in FIG. 3 suppose the scrambling sequence in block 320 is 0101 and the output bits from the convolutional code in block 310 are 1101, If the scrambling code flips the output bits, then the sequence after scrambling will be 1000. When the UE decodes this sequence, the UE will invert the scrambling using its own sequence, and then pass the resulting information through a convolutional decoder. The effect of this scrambling is that when the transmission is not intended for the UE, path metrics calculated using a Viterbi decoding algorithm of the convolutional code are quite low. A discussion of the Viterbi algorithm, which is utilized by the above-mentioned UE-specific scrambling or masking approach to error detection, as well as a discussion of path metrics follows.

Viterbi Algorithm

The Viterbi algorithm for convolutional decoding is a known decoding algorithm that is optimum in the sense that it yields the maximum likelihood (ML) or most likely sequence of bits based on using the output values from the channel. Viterbi decoding is the standard technique to decode convolutional codes regardless of whether a CRC is used or not. A description of the Viterbi algorithm for decoding convolutional codes may be found in a standard communications textbook such as 'Digital Communications" by J. G. Proakis, $2^{nd}$ Edition, McGraw Hill. Some of the concepts are repeated briefly below for convenience.

A convolutional encoder comprises a number of shift registers or memory elements. The number of shift registers is called the constraint length of the code, and each shift register stores exactly 1 bit of information. Each time a new bit comes in, it is read into a leftmost shift register location and the contents of each shift register are shifted to the shift register on the immediate right. The contents of the rightmost shift register are obviously thrown out. Thus, a convolutional encoder may be viewed as a linear filter that operates on bits.

A convolutional encoder is also characterized by a code rate. In general, the code rate defines how many output bits are produced for every input bit. Therefore a code rate of 1/r implies that for every information bit inputted, r coded bits are output by the encoder. Thus, the larger the value of r, the more powerful the code (i.e. the greater its ability to correct transmission errors). Finally, how the r output bits are produced needs to be specified; this is given by the connections of shift register elements to exclusive-OR elements.

FIG. 4 is a state diagram of a simple convolutional encoder 400. Convolutional encoder 400 has a constraint length k=3 and a rate=½, as is known. The constraint length defines the number of shift-register elements that are used. The shift register elements are part of a memory or shift register in the UE. In FIG. 4, there are three shift register elements 410, 420 and 430. Shift register element 410 will contain the most recently inserted information bit. Each time a new information bit comes in, the previous bits are shifted to the right, so the middle element 420 contains the next-to-most-recent bit and the right most element 430 contains the third most recent bit (e.g., least recent bit). XOR operations at 440 and 450 determine how the coded bits are determined. Each time an information bit 415 is input, two coded bits 445 and 455 are output, as shown in FIG. 4.

FIG. 5 illustrates a trellis diagram 500 to explain how the Viterbi algorithm, and specifically Viterbi decoding, is implemented at the UE. States in the trellis, represented by black dots in FIG. 5, denote the four possible shift register contents (00, 01, 10 or 11, shown along the left-hand side of the trellis diagram) when a bit comes in. Therefore for binary convolutional codes, the number of states is $2^{constraint\ length-1}$, or $2^{k-1}$. For each information bit inputted, the center shift register element 420 and rightmost element 430 would therefore be at a state of 00, 01, 11 or 10, depending on the state of the previous two information bits that have been shifted right. The first bit in the state is defined as the least recent bit (contents of the rightmost shift register 430) and the second bit (contents of the middle shift register 420) is defined as the next least recent bit. So if the previous two bits were 1 and 0, then the state will be 01.

The trellis diagram is provided for the convolutional coding shown in FIG. 4, and is drawn for seven (7) levels (levels represented by J, where J=1 to 7) corresponding to 7 information bits The trellis diagram in FIG. 5 assumes that two (2) tail bits are used to terminate the trellis and return the decoder back to the state 00. In general, the number of tail bits required would be equal to the constraint length minus 1 (k−1).

Each level J (J=1 to 7) across the top of the trellis diagram in FIG. 5 corresponds to each information bit. Prior to inputting the first bit, the two shift register elements 420 and 430 are always set to 0, so the starting state at level J=0 is always 00. If the first information bit is a 0, then at level J=1 the decoder remains at state 00. On the other hand, if the first information bit into decoder 400 at J=0 is a 1, then the decoder 400 moves to state 01 at level J=1. Each possible transition from one level to the next is called a branch. A sequence of connected branches is called a path through the trellis.

The Viterbi algorithm proceeds by computing what is termed a "branch metric" at each J level. The branch metric is obtained by "correlating" the received bits from the channel with the bits that would have been sent if that branch were taken as the correct channel for the UE. The higher the correlation, the more likely the branch was the correct one. So, in an example where the actual bits received from the channel for a particular J level are 10, then any branch that would have produced a branch metric of 10 at that J level has the highest correlation.

Branch metrics from previous J levels are summed to yield what is called a path metric. The higher the value of the path metric, the more likely that the path metric corresponds to the actual transmitted sequence of bits. Two paths will merge at every state in the trellis and at every level. Viterbi decoding therefore entails comparing the path metrics of the two merging or competing paths and discarding the one with the worse (lowest valued) path metric. Occasionally, due to noise, the incorrect path is chosen over the correct one during one of the aforementioned merging instances. This results in a decoding error. Accordingly, the path that is selected by the Viterbi algorithm is called the survivor or winning path.

There is at most one winning path per state, per level. Since tail bits are used, the state at the last level will always be an all-zero state. In the example, 2 tail bits are used and the state at the last level is 00. As stated before, two paths will merge at the 00 state at the last level. Accordingly, the Viterbi decoding algorithm selects the path with the larger path metric at this last (J=7) level. This path now is the eventual winning path and represents the "most likely" sequence of transmitted bits.

Accordingly, in the scrambling approach where no CRC is used for error detection, error detection is performed using Viterbi decoding with the scrambling approach. In this context, the conventional method is to determine a path metric difference between the merging paths in the last level (e.g. J=7 in the trellis diagram of FIG. 5). If that calculated path metric difference is below a predetermined threshold, then the decoding is considered unreliable, and the UE declares that the transmission on that particular HS-SCCH was not intended for it. This is termed an End Path Metric Difference (EPMD) approach to error detection. The EPMD approach avoids transmission of CRC bits and thus lowers the processing requirement at the UE.

SUMMARY OF THE INVENTION

An efficient and reliable method of detecting errors in control channels of a wireless communication system is provided in order to ensure that for each UE in the system, the probability of error detection is high and the probability of false alarm is low. In an embodiment, the method decodes at least a portion of a control channel, determines if one or more control channels were successfully received during the decoding, and selects one of the successively received control channels based on at least one calculated metric.

More particularly, Part I of each HS-SCCH that is simultaneously received (i.e., 4 HS-SCCH's) is decoded by a UE. The UE includes techniques to determine if one or more of the HS-SCCH's were successfully received during the decoding step. If more than one HS-SCCH was successfully received, the method selects only one of the successively received HS-SCCH's based on calculated path metric differences (PMD) that serve as a "tie-breaking" mechanism to select the correct HS-SCCH for a particular UE.

In an embodiment, the method utilizes a Yamamoto-Itoh (YI) decoding algorithm in order to determine how many HS-SCCH's were successfully received during the decoding step. In another embodiment, a base station appends a parity check code to Part I of each HS-SCCH, and the UE uses the parity check code during decoding in order to determine which of the HS-SCCH's were successfully received. The parity check code may be used with the aforementioned YI algorithm to provide additional reliability, and then the calculated PMD's are used to break any ties, should multiple HS-SCCHs be successfully received.

In a further embodiment, a base station appends a scrambling group code identifier (SCGI) code to Part I of each HS-SCCH, and the UE checks the appended SCGI code during decoding in order to determine which of the HS-SCCH's were successfully received. The SCGI code may be used with the aforementioned YI algorithm to provide additional reliability, and then the calculated PMD's are used to break any ties, should multiple HS-SCCHs be successfully received. Each of the YI algorithm, parity check code approach and SCGI code approach may be referred to as "hard" metrics that give a "good" or "bad" determination on each HS-SCCH.

The calculated PMD metric is calculated using at least one of several metrics that may be referred to as "soft" metrics. The calculated PMD metrics used to select only one HS-SCCH for a UE include one or more of a minimum path metric difference (MPMD) metric, an aggregate path metric difference (APMD) metric, a frequency path metric difference (FPMD) metric, etc. As will be explained below, each of these metrics are calculated in conjunction with using the aforementioned Viterbi decoding algorithm. For the selected HS-SCCH, the UE will decode Part II of the HS-SCCH and will begin buffering data from the shared downlink data channel (HS-DSCH) that corresponds to the selected HS-SCCH.

BRIEF DESCRIPTION OF THE DRAWINGS

The present invention will become more fully understood from the detailed description given hereinbelow and the accompanying drawings, wherein like elements are represented by like reference numerals, which are given by way of illustration only and thus are not limitative of the present invention and wherein.

DETAILED DESCRIPTION

Although the principles of the invention are particularly well-suited for wireless communications systems based on the well-known High Speed Downlink Packet Access (HS-DPA) specification in the Universal Mobile Telecommunication System (UMTS) standard, and will be described in this exemplary context, it should be noted that the embodiments shown and described herein are meant to be illustrative only and not limiting in any way. As such, various modifications will be apparent to those skilled in the art for application to other transmission systems and are contemplated by the teachings herein. Additionally where used below, user equipment (UE) is synonymous to a mobile station in a wireless communication network.

Accordingly, there is now described a method for detecting errors in control channels of a wireless communication system that overcomes the problems of inadequate error detection and false alarm performance, which are present in the conventional scrambling or EPMD approaches described above. The conventional scrambling or EPMD approach to error detection usually does not yield adequate error detection/false alarm performance. This is because the approach is based on a path metric difference calculated at only the last level in the trellis.

The calculated metric at this last level is usually a very noisy metric. The reason why EPMD is a noisy metric, as to the quality of a frame, is because EPMD only uses a last path metric comparison to determine if a frame is in error or not. EPMD does not consider what happened during the "journey" of the eventual winning path as it progressed through the trellis. Accordingly, the EPMD approach does not capture the fact that, at an earlier level in the decoding (as seen in the trellis diagram of FIG. 5 for example), the winning path may have come very close to another merging or competing path, thus rendering it unreliable.

Figure 6:
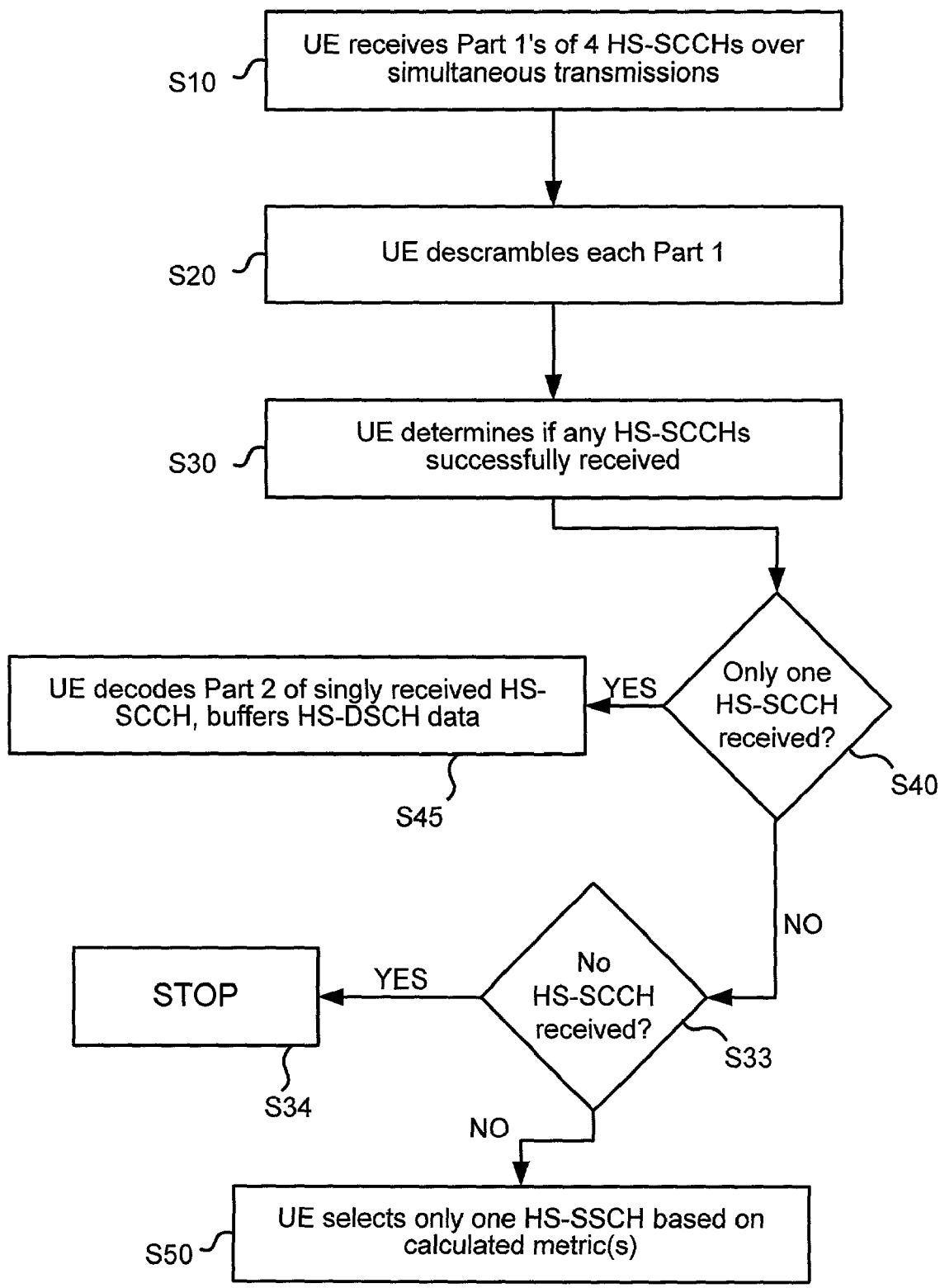
FIG. 6 is a flowchart illustrating the error detection method in accordance with the invention.

FIG. 6 is a flowchart illustrating the error detection method in accordance with the invention. In FIG. 6, initially a UE receives up to four (4) Part I's of 4 HS-SCCHs over simultaneous transmissions (Step S10). The UE descrambles Part I in each HS-SCCH and decodes each Part I (Step S20).

Figure 1:
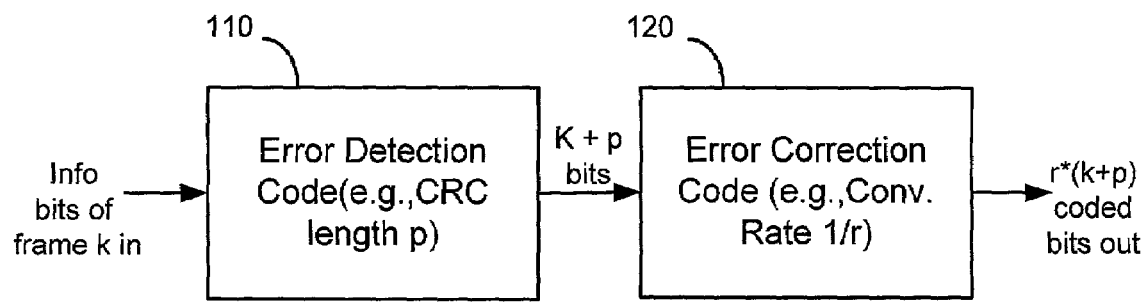
FIG. 1 illustrates a process flow for forming a typical concatenated code structure that is transmitted by a base station in accordance with the invention.
Figure 2:
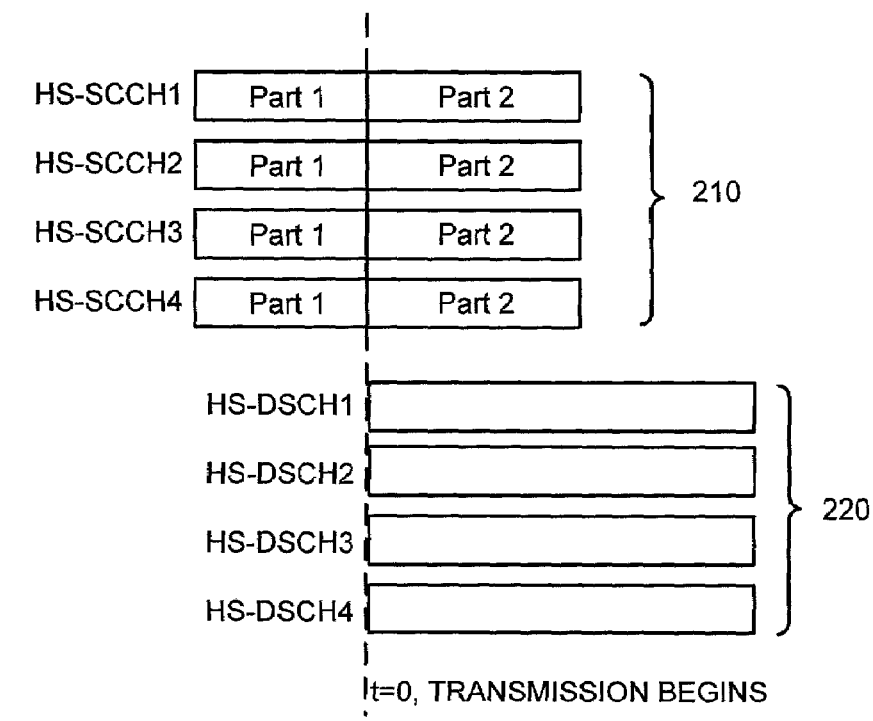
FIG. 2 illustrates the relationship between shared control channels and shared downlink data channels in accordance with the invention.
Figure 3:
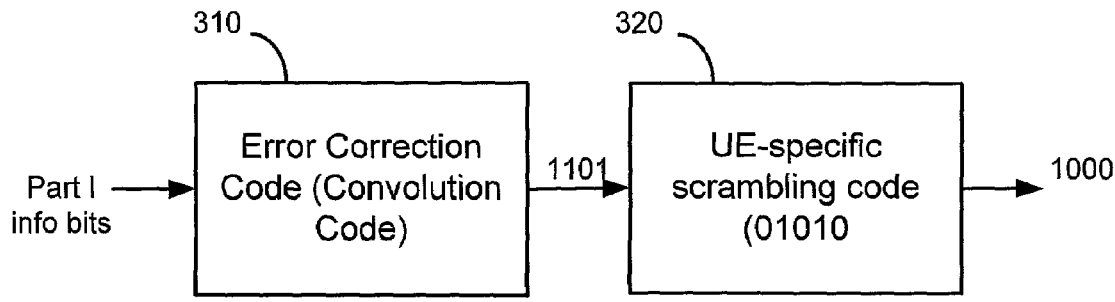
FIG. 3 illustrates use of a scrambling code with a convolutional error correction code.

In accordance with the method of the invention, each embodiment described hereafter receives scrambled convolutional codes that are contained in Part I of each HS-SCCH. The scrambling is done by the scrambling approach outlined in FIG. 3 At the UE, the UE inverts the scrambling (i.e., descrambles the bits) using its own unique sequence, as described above, and passes the de-scrambled bits to a convolutional decoder in the UE for decoding. This step of descrambling is performed by each of the embodiments discussed hereafter.

The method utilizes several different algorithms or codes in order to determine (Step S30) how many HS-SCCHs are "good" or "bad". In other words, this step determines if a HS-SCCH was successfully received during the decoding step. The different methods, which should not be held as limiting, are described in detail below (see e.g., Step S130 in FIG. 7, and Step S230 in FIG. 9). At Step S40, the number of successfully received HS-SCCHs are determined. If only one HS-SCCH was successfully received during the decoding (output of Step S40 is YES), at Step S45 Part II of the HS-SCCH is decoded and the UE begins buffering data from the HS-DSCH that corresponds to the HS-SCCH.

If either no HS-SCCH was a successor or more than one HS-SCCH was successfully received (NO at Step S40), the UE determines if no HS-SCCH was successfully received at Step S33. If the output of Step S33 is YES, the processing is stopped (Step S34).

If more than one HS-SCCH was a success (NO at Step S33), meaning that two or more HS-SCCHs were successfully received, the method must select only one HS-SCCH (Step S50) based on a calculated metric. This is because there can be only one correct HS-SCCH for each UE, and hence only one HS-DSCH with the intended transmission for that UE. In Step S50 a path metric difference (PMD) is calculated for each remaining good HS-SCCH. The path metric difference (PMD) is the aforementioned soft metric that is calculated as a tie-breaking mechanism between successfully received HS-SCCHs in order to select only one HS-SCCH to fully decode.

Calculated PMDs include calculating a minimum path metric difference (MPMD), an aggregate path metric difference (APMD), and a frequency path metric difference (FPMD), or combinations of one or more of these metrics, in order to select only one HS-SCCH for decoding of Part II, and for buffering data from the HS-DSCH corresponding to the selected HS-SSCH. As will be discussed in further detail below, each of the MPMD, APMD and FPMD metric values are determined in conjunction with using the Viterbi decoding algorithm discussed above in order to determine a winning path at each of the states.

These soft metrics from the decoding process are generally preferred over channel quality metrics since they are closer to the decoded bit-stream in the receiver chain at the UE. In the case of convolutional codes, the soft metrics attempt to exploit differences in path metrics of merging paths at each state during Viterbi decoding. As a result, most of the soft metrics are based on a decoding algorithm that will explained in further detail below. In describing these metrics, the following notations are used:

(a) $\lambda_j(1)$ is the path metric of the chosen (decoded) path at the jth level in the trellis; and (b) $\lambda_j(2)$ is the path metric of the of the path that merges with the chosen path at the jth level in the trellis.

Under an assumption that the path labeled "1" is the chosen path at each level, $\lambda_j(1)$ will always be larger than $\lambda_j(2)$ The actual values of the path metrics are not of much importance, as compared to their relative values and the corresponding number of decoded bit-errors.

To calculate the MPMD metric, the method retains a minimum path metric difference value by which the winning path at each state beats a competing or merging path at each state. The winning path having the largest minimum difference metric value corresponds to the HS-SCCH that is selected for decoding of Part II and buffering of the data on the corresponding HS-DSCH.

In order to determine the MPMD metric, in addition to determining the survivor path by Viterbi decoding, the metric, $\lambda_j(1)-\lambda_j(2)$ is retained at the time of comparison. Assuming that there are N levels in the trellis, where N represents the number of information bits and tail bits in a frame, the MPMD is defined as:

$$\Lambda = \min_j [\lambda_j(1) - \lambda_j(2)], \qquad (4)$$

where j is the level index. At the end of Viterbi decoding, the selected path is evaluated and the minimum metric for that path is chosen as the winning path metric, or frame quality metric. The intuition for using the MPMD metric is that if at any level during the decoding process a merging path value comes close to a winning path value, then there is less confidence in the decision of choosing that winning path. Since the winning path in the trellis is obviously not known during the decoding process, the current minimum value at each state is stored during the decoding process. Once decoding is complete, an array value of the metric corresponding to the terminating state (state terminated by tail bits) becomes the value of the winning path metric For the APMD metric, the method retains an aggregate sum of the PMD by which the winning path at each state beats a competing or merging path at each state. The winning path having the largest aggregate sum corresponds to the HS-SCCH that is selected for decoding of Part II and buffering of the data on the corresponding HS-DSCH.

The sum of the YI algorithm metrics at each comparison in the trellis is evaluated. In the notation defined above with respect to MPMD, the APMD metric is given by $$\Lambda = \sum_{j=1}^{K} [\lambda_j(1) - \lambda_j(2)]. \qquad (5)$$

Since the number of levels in the trellis per frame is fixed, the aggregated metric is a scaled version of the average metric. The intuition for using the APMD metric is that it represents the confidence with which the survivor or winning path was selected over the merging path at each state in the trellis. As in the case of the minimum metric, an array having a length equal to the number of states that contain the current value of $\Lambda$ for each state is required. At the end of the decoding process, an array value of the metric corresponding to the terminating state (state terminated by the tail bits) becomes the value of the winning path metric.

For the FPMD metric, the method counts a number of times by which the winning path at each state came within a threshold value of beating a competing path at said state. The winning path having the lowest frequency of coming within said threshold corresponds to the HS-SCCH that is selected for decoding of Part II and buffering of the data on the corresponding HS-DSCH.

Figure 7:
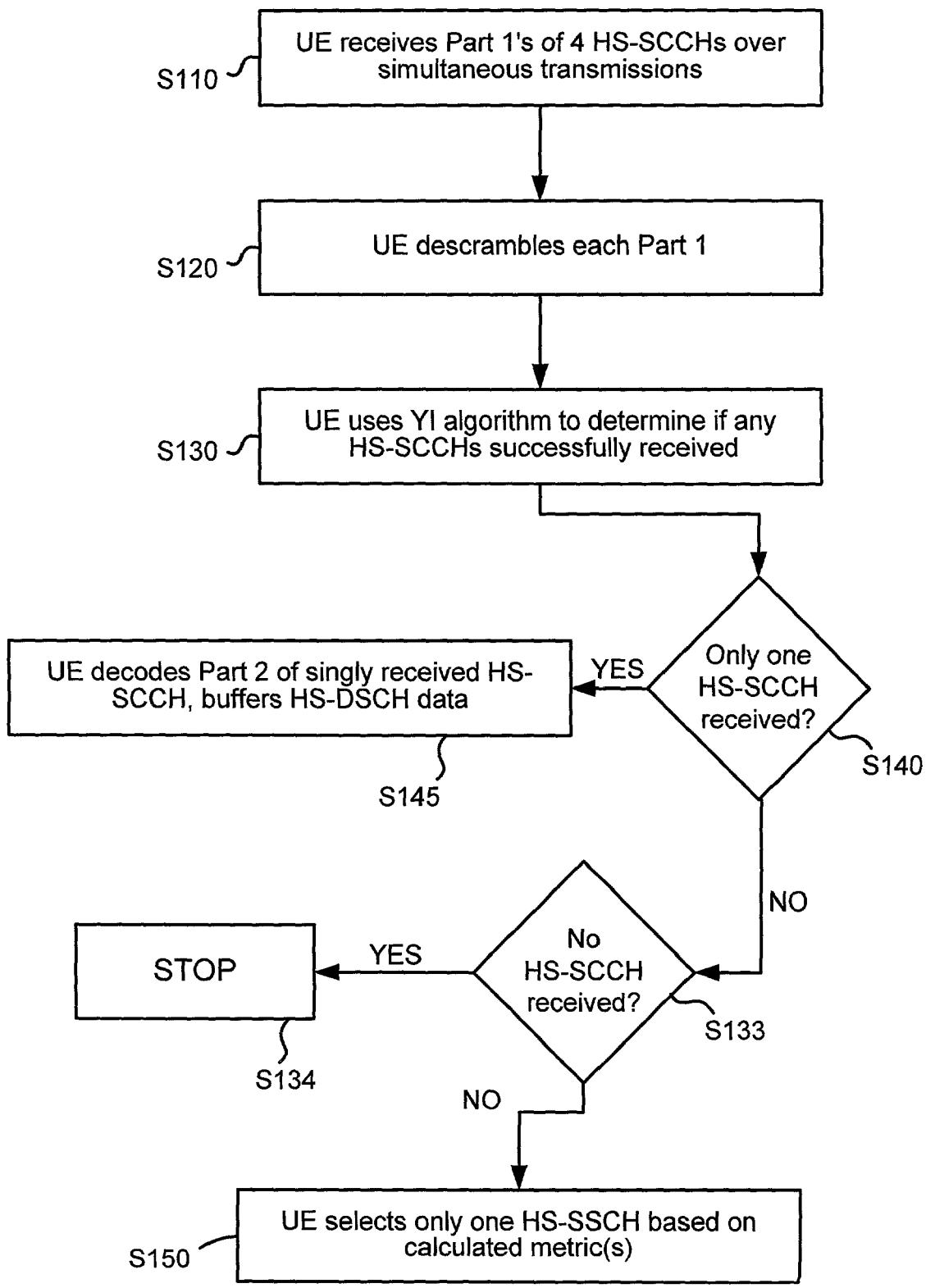
FIG. 7 is a flowchart illustrating one embodiment of the error detection method in accordance with the invention.

FIG. 7 is a flowchart illustrating an embodiment of the error detection method in accordance with the invention. As described with respect to FIG. 6, Steps S110, S120 and S150 in FIG. 7 are the same as Steps S10, S20, and S50 in FIG. 6, thus a detailed discussion of these steps is omitted. However, in this embodiment, Part I of the HS-SCCH is encoded using the Yamamoto-Itoh (YI) encoding algorithm and the method uses a Yamamoto-Itoh (YI) decoding algorithm in order to determine (Step S130) how many HS-SCCHs have been successfully received at the UE.

The YI decoding algorithm, known in literature, offers a superior approach to error detection in wireless communication systems employing frame-based communication. At every level and every state in the trellis diagram of FIG. 5 for example, the YI algorithm would retain a flag indicating whether the winning path at that state has come within a threshold of a merging path. If the answer is YES, the flag is set to "unreliable"; and if the answer is NO, the flag is set to "reliable". At the end of decoding, the flag for the winning path is checked. If a flag in the winning path has been set to "unreliable", the decoding is considered to have failed. In the context of decoding a HS-SCCH, this means that the UE will determine that it is not the intended recipient.

In the scrambling based approach, using the YI algorithm instead of EPMD results in much better detection/false alarm probability. However, in the context of decoding a HS-SCCH, the YI decoding algorithm alone may still not be sufficient. Therefore, refining, "composite metrics" calculations may be desirable.

For example, a UE may decode Part I data portions in each of the 4 HS-SCCHs, and determine by using the YI algorithm of Step S130 that more than one of the decoded Part I's are evaluated as reliable.

If only one HS-SCCH was successfully received during the decoding (output of Step S140 is YES), at Step S145 Part II of the HS-SCCH is decoded and the UE begins buffering data from the HS-DSCH that corresponds to the HS-SCCH. If either no HS-SCCH was a successor or more than one HS-SCCH was successfully received (NO at Step S140), the UE determines if no HS-SCCH was successfully received at Step S133. If the output of Step S133 is YES, the processing is stopped (Step S134).

If more than one HS-SCCH was a success (NO at Step S133), this means that two or more HS-SCCHs were successfully received, the method must select only one HS-SCCH (Step S150). As there can be only one transmission to a UE per TTI, clearly one of those HS-SCCHs is a false alarm. Accordingly, in accordance with this embodiment of the invention, the UE applies the "tie-breaking" procedure discussed above with respect to Steps S50/S150 in order to select the one HS-SCCH for that UE.

Figure 8:
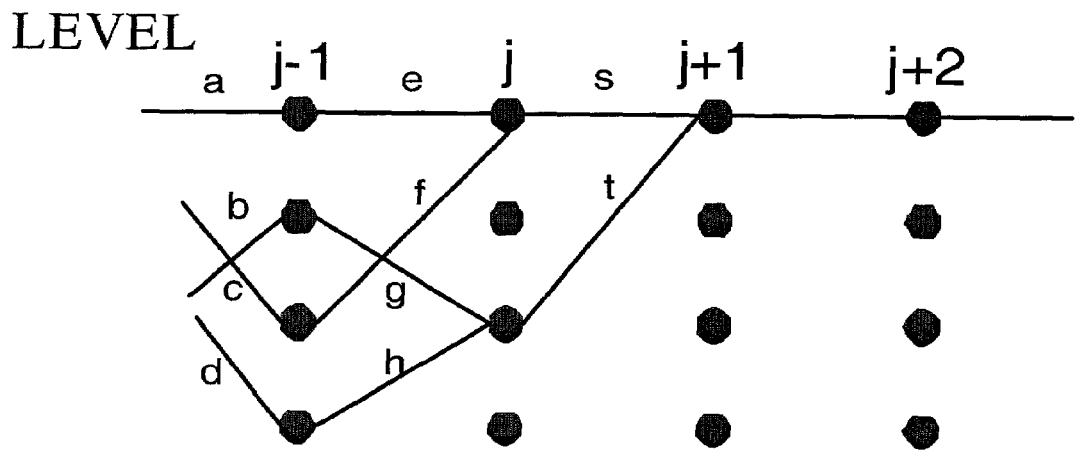
FIG. 8 is a trellis diagram for illustrating how the method of FIG. 7 successfully decodes the correct shared control channel.

FIG. 8 is a partial trellis diagram to illustrate the operation of the YI algorithm. The YI algorithm can be classified as a hard metric indicating a good result (e.g., the transmission is intended for that UE and the UE successfully determines that the transmission is intended for it), or bad result (e.g., the UE determines that it is not the intended recipient). Accordingly, where more than one HS-SCCH is evaluated as good, the aforementioned soft metrics act as a tie-breaking mechanism to determine the correct HS-SCCH, and hence correct HS-DSCH. Therefore, the MPMD, APMD and FPMD soft metrics, based on path metric differences, may be calculated in Step S150 for use as convolutional codes so that the UE decodes the correct HS-SCCH.

For applications where the use of a CRC for error detection is expensive, the YI algorithm provides an alternative method for performing error detection. The algorithm works in conjunction with Viterbi decoding of convolutional codes with very little processing overhead. The YI decoding algorithm is based on the principle that when two paths merge in the trellis and are close in terms of their path metrics, selection of the one path over the other is more prone to error.

Figure 4:
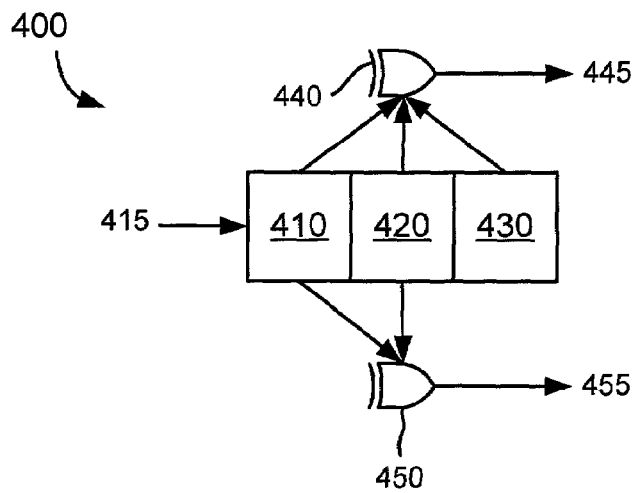
FIG. 4 is a state diagram of a simple convolutional encoder.
Figure 5:
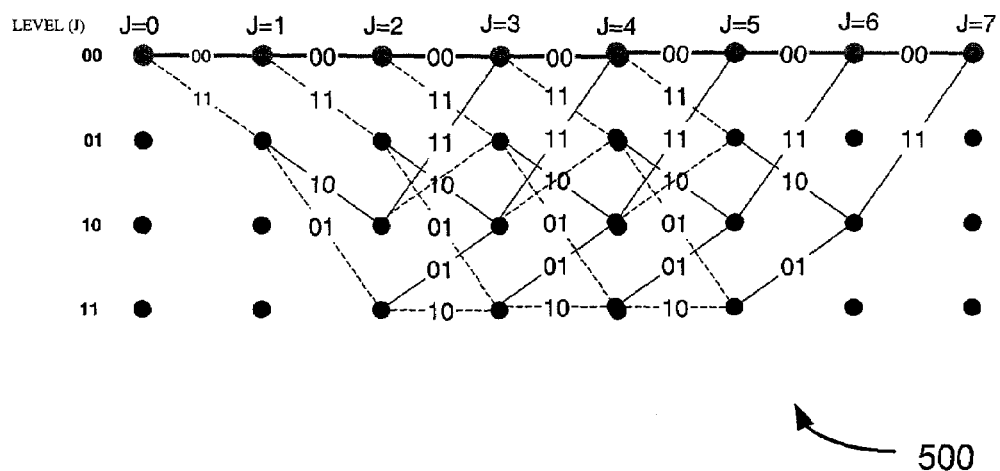
FIG. 5 illustrates a trellis diagram to explain how the Viterbi algorithm is implemented in a decoder of a UE.

The YI algorithm is generally explained by considering the simple rate ½, constraint length k=3, convolutional code of FIG. 4, whose trellis is plotted in FIG. 5. A general description of the YI algorithm is as follows. To start with, at level (k−1), identify the 2k−1 paths with a label C. Then, at each of the levels j (j=k, k+1, . . . ), select the path "a" that has the largest log likelihood value ($\lambda j(a)$) and the path "b" that has the next largest log likelihood value $\lambda j(b)$ among the merging paths. If path a has a label C at level (j−1) and the difference between $\lambda j(a)$ and $\lambda j(b)$ is greater than or equal to A, a threshold value that is a given positive constant, then let path "a" survive (survivor path) with label C (e.g., reliable). Otherwise, path a survives with label X (e.g., unreliable). Paths other than path "a" at that state are discarded.

A survivor or winning path at each state is selected by the maximum likelihood decision in exactly the same way as paths are selected using the ordinary Viterbi decoding algorithm. The YI algorithm reduces to the ordinary Viterbi decoding algorithm if A, the threshold value, is equal to zero.

Referring now to the partial trellis diagram of FIG. 8, assume that paths a, b, c and d are survivor paths with label C at level j−1. At level j, paths a–e and c–f merge at one state, and paths b–g and d–h merge at another. If $$\lambda_j(a-e) \geq \lambda_j(c-f) + A \quad (1)$$

and $$\lambda_j(d-h) < \lambda_j(b-g) < \lambda_j(d-h) + A, \quad (2)$$

then path a–e survives with label C and path b–g survives with label X. As shown in FIG. 8, at level j+1, paths a–e–s and b–g–t merge. Even if $$\lambda_{j+1}(b-g-t) \geq \lambda_{j+1}(a-e-s) + A, \quad (3)$$

path b–g–t survives with label X, because path b–g already has a label X at level j.

The above procedure is continued until the entire frame is decoded. At that point, if the survivor path with the best path metric (the chosen path) is labeled X, an error is declared. Otherwise, the frame is accepted as being good. The YI algorithm operates on the intuition that the further apart the path metrics being compared at a state are from each other (winning path to other merging path) the greater the confidence in the chosen survivor (winning) path.

Figure 9:
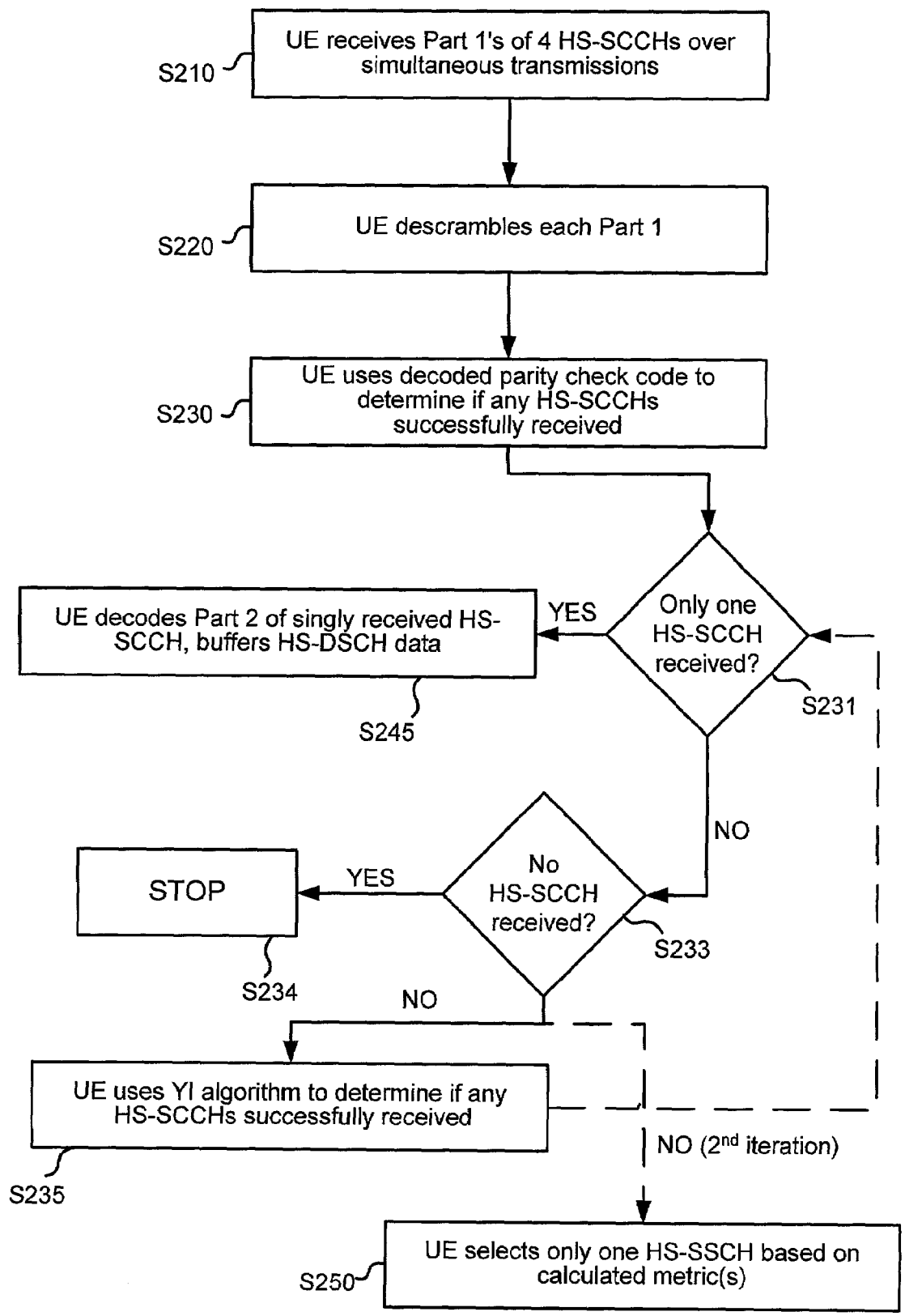
FIG. 9 is a flowchart illustrating another embodiment of the error detection method in accordance with the invention.

FIG. 9 is a flowchart illustrating another embodiment of the error detection method in accordance with the invention. As described with respect to FIG. 6, Steps S210, S220, S231 and S250 are the same as Steps S10, S20, S40 and S50 in FIG. 6, thus a detailed discussion of these steps is omitted. However, in this embodiment, the method uses a parity check code in order to determine (at Step S230) how many HS-SCCHs have been successfully received by the UE.

Another approach to error detection is to use a few parity check bits to provide additional reliability in error detection. In a parity check code each parity check bit is computed by an exclusive OR operation on 2 or more of the information bits. Depending on how each parity check bit is computed a variety of parity check codes result for the same number of parity bits. For example, assuming there are three information bits and two parity check bits, one possibly parity check code would be where the first parity check bit is computed by exclusive-OR of the $1^{st}$ and $3^{rd}$ information bits and the second parity check bit is computed by exclusive-OR of the $2^{nd}$ and $3^{rd}$ bit. Another parity check code may compute the first parity bit using the $1^{st}$ and $2^{nd}$ information bits and the $2^{nd}$ parity bit is computed using the $1^{st}$ and $3^{rd}$ information bit. One or more parity bits may also simply be repetitions of certain information bits.

Figure 10:
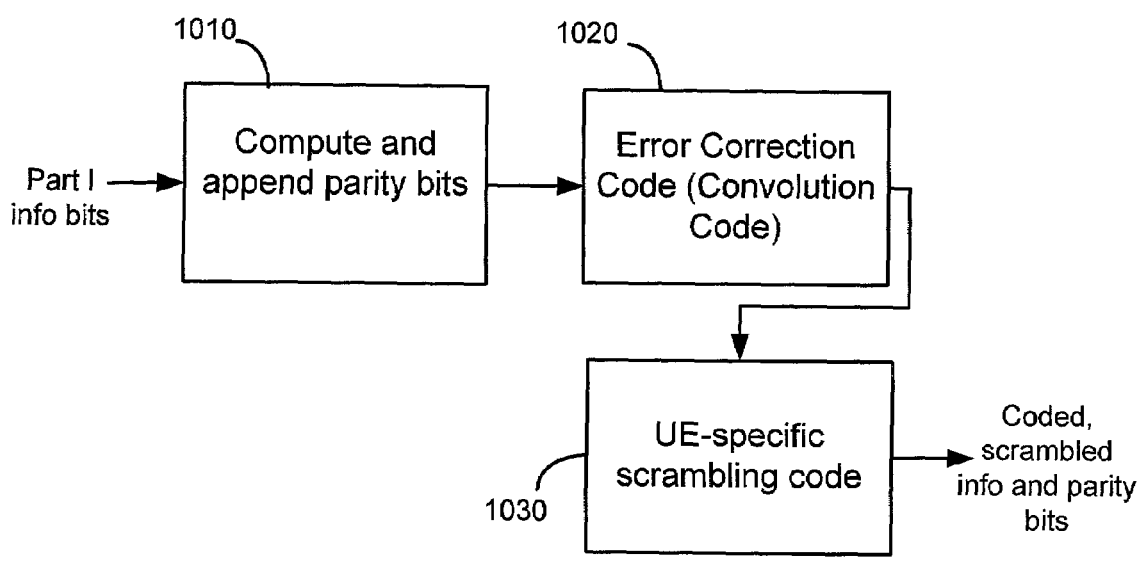
FIG. 10 illustrates a process flow of how parity check code bits are used in conjunction with the scrambling code at the base station.

The parity check result, when used in conjunction with the YI algorithm and the PMD soft metrics defined above, greatly improves detection/false alarm performance. FIG. 10 illustrates a process flow of how parity check code bits are used in conjunction with the scrambling code at the base station. For example, consider a Part I of an HS-SCCH having 8 information bits, with 4 parity check code bits computed and appended to the 8 information bits in block 1010. For each HS-SCCH, the information bits with appended parity bits are convolutionally encoded at block 1020 and then scrambled at block 1030 using the scrambling approach described with reference to FIG. 3. For 4 HS-SCCHs this increases the peak data rate processing to be 72 Kbps, which is still substantially better than what would be required using a 12-bit or higher CRC code.

Refer now to FIG. 9, a UE may decode Part I data portions in each of the 4 HS-SCCHs, and in Step S230 determine by using the parity check code that one or more of the decoded Part Is are evaluated as reliable. Specifically, the parity check code decoded by the UE is used to test if any of the HS-SCCHs pass. If one SCCH was a success (YES at Step 231), as in the previous embodiment, then Step S245 is performed—decode Part II for that HS-SCCH and begin buffering data from the corresponding HS-DSCH. If either no HS-SCCH was a successor or more than one HS-SCCH was successfully received (NO at Step S231), the UE determines if no HS-SCCH was successfully received at Step S233. If the output of Step S233 is YES, the processing is stopped (Step S234). If more than one HS-SCCH was a success (NO at Step 233), then the method uses the YI algorithm in a Step S235 to obtain a reliable or unreliable indicator of the HS-SCCHs and processing returns to Step S231. If at Step S231 exactly one SCCH was a success (output of Step S231 is YES), then at Step S245 decode Part II for that HS-SCCH and begin buffering data from the corresponding HS-DSCH. If no HS-SCCHs passed or if more than one HS-SCCH still passed, (output of step S233 is NO in the second iteration, illustrated by dotted lines) then in step S250, the APMD, FPMD and/or MPMD metrics are calculated and used to break ties so as to select only one HS-SCCH to decode.

As there can be only one transmission to a UE per TTI, clearly one of the HS-SCCHs is a false alarm. Thus, in accordance with this embodiment of the invention, the UE may eventually apply the "tie-breaking" procedure discussed initially above at Step S50 of FIG. 6 in order to select the one HS-SCCH for that UE.

In yet a further embodiment, error detection is performed using an alternative code to the parity check code, called a scrambling code group identifier (SCGI) code. The SCGI code is appended to each Part 1 of a HS-SCCH as in FIG. 10. The SCGI identifies the scrambling code group to which the HS-SCCH transmission belongs, and is transmitted along with Part I. Each UE decodes Part I on each HS-SCCH and checks if the SCGI corresponds to its UE-specific scrambling code group. If none of the SCGI codes match the UE-specific scrambling code group, the UE determines that none of the HS-SCCHs are intended for it. If exactly one SGCI code matches, it will proceed to decode Part II of that SCCH and also begins buffering the corresponding DSCH. If more than one SCGI code matches its group, the UE will then break ties either using the YI algorithm and/or the soft metrics, as previously defined above.

The principle behind the above approach is to divide the total set of scrambling codes into groups. If a p-bit SCGI is used, then $2^P$ groups are formed. The assignment of scrambling codes to UEs (done at call set up time) balances the number of UEs in each scrambling code group. This reduces the likelihood of simultaneous transmissions to UEs in the same code group, thereby improving the false alarm probability. The SCGI approach is relatively simple to implement at the base station and at the UE, since unlike the parity check code, all that is required is the insertion or appending of the SCGI bit field to the information bits prior to the encoding of Part I of a HS-SCCH.

The invention being thus described, it will be obvious that the same may be varied in many ways. The above-described algorithms has been described as comprised of several components, flowcharts or blocks, it should be understood that the methods can be implemented in application specific integrated circuits, software-driven processor circuitry, or other arrangements of discrete components. Such variations are not to be regarded as a departure from the spirit and scope of the invention, and all such modifications as would be obvious to one skilled in the art are intended to be included within the scope of the following claims.

We claim:

1. A method of detecting errors in control channels of a wireless communication system, comprising:
    decoding at least a portion of each control channel;
    determining if one or more control channels were successfully received during the decoding step; and
    selecting one of the successfully received control channels based on at least one calculated metric including at least one path metric difference (PMD); wherein said step of selecting includes,
        calculating a path metric difference (PMD) metric for each control channel determined as successfully received, when more than one control channel are successfully received as determined by said determining step, and
    selecting one of the successfully received control channels based on the calculated PMDs, wherein said step of calculating includes,
        calculating at least one of a minimum path metric difference (MPMD) metric, an aggregate path metric difference (APMD) metric, and a frequency path metric difference (FPMD) metric for each successfully received control channel, wherein said step of calculating the at least a frequency path metric difference (FPMD) metric includes,
            performing Viterbi decoding to determine a winning path metric at each of a plurality of states, and
            counting a number of times by which the winning path at each state came within a threshold value of beating a competing path at said each state, wherein the winning path having the lowest frequency of coming within said threshold corresponds to the one successfully received control channel selected in the selecting step.

2. The method of claim 1, wherein said step of determining includes performing a cyclic redundancy check.

3. The method of claim 1, wherein said step of determining includes performing a Yamamoto-Itoh (YI) decoding algorithm.

4. The method of claim 3, wherein said step of determining includes using a parity check code appended to each portion of each control channel in conjunction with the YI algorithm to determine if one or more control channels were successfully received during the decoding step.

5. The method of claim 3, wherein said step of determining includes using a scrambling group code identifier (SCGI) code appended to each portion of each control channel in conjunction with the YI algorithm in order to determine if one or more control channels were successfully received during the decoding step.

6. The method of claim 1, wherein said step of determining includes using a parity check code appended to each portion of each control channel to determine if one or more control channels were successfully received during the decoding step.

7. The method of claim 1, wherein said step of determining includes using a scrambling group code identifier (SCGI) code appended to each portion of each control channel to determine if one or more control channels were successfully received during the decoding step.

8. The method of claim 1, wherein said step of calculating an MPMD metric comprises:
    performing Viterbi decoding to determine a winning path metric at each of a plurality of states, and
    retaining a minimum difference metric value by which the winning path at each state beat a competing path at said each state, wherein the winning path having the largest minimum difference metric value corresponds to the one successfully received control channel selected in the selecting step.

9. The method of claim 1, wherein said step of calculating an APMD metric comprises:
    performing Viterbi decoding to determine a winning path metric at each of a plurality of states, and
    retaining an aggregate sum of the PMDs by which the winning path at each state beat a competing path at said each state, wherein the winning path having the largest aggregate sum corresponds to the one successfully received control channel selected in the selecting step.

10. A method of detecting errors in control channels of a wireless communication system, comprising:
    decoding at least a portion of each control channel;
    performing a Yamamoto-Itoh (YI) decoding algorithm to determine if one or more control channels were successfully received during the decoding step; and
    selecting one of the successfully received control channels determined by the YI algorithm based on at least one calculated metric, the at least one calculated metric including at least one path metric difference (PMD); wherein step of selecting includes,
        calculating a path metric difference (PMD) metric for each control channel, when more than one control channel are successfully received as determined by said YI algorithm, and
    selecting one of the successfully received control channels based on the PMDs calculated, wherein said step of calculating includes,
        calculating at least one of a minimum path metric difference (MPMD) metric, an aggregate path metric difference (APMD) metric, and a frequency path metric difference (FPMD) metric for each successfully received control channel, and wherein said step of calculating a frequency path metric difference (FPMD) metric includes,
            performing Viterbi decoding to determine a winning path metric at each of a plurality of states, and counting a number of times by which the winning path at each state came within a threshold value of beating a competing path at said each state, wherein the winning path having the lowest frequency of coming within said threshold corresponds to the one successfully received control channel selected in the selecting step.

11. The method of claim 10, wherein said step of calculating an MPMD metric comprises:
performing Viterbi decoding to determine a winning path metric at each of a plurality of states, and
retaining a minimum difference metric value by which the winning path at each state beat a competing path at said each state, wherein the winning path having the largest minimum difference metric value corresponds to the one successfully received control channel selected in the selecting step.

12. The method of claim 10, wherein said step of calculating an APMD metric comprises:
performing Viterbi decoding to determine a winning path metric at each of a plurality of states, and
retaining an aggregate sum of the PMD's by which the winning path at each state beat a competing path at said each state, wherein the winning path having the largest aggregate sum corresponds to the one successfully received control channel selected in the selecting step.

* * * * *